(12) United States Patent  
Saito et al.

(10) Patent No.: US 8,497,163 B2  
(45) Date of Patent: Jul. 30, 2013

(54) METHOD FOR MANUFACTURING A CIRCUIT DEVICE

(71) Applicant: Sanyo Electric Co., Ltd, Osaka (JP)

(72) Inventors: Koichi Saito, Ogaki (JP); Yoshio Okayama, Moriyama (JP); Yasuyuki Yanase, Ogaki (JP)

(*) Notice: Subject to any disclaimer, the term of this patent is extended or adjusted under 35 U.S.C. 154(b) by 0 days.

(21) Appl. No.: 13/662,017

(22) Filed: Oct. 26, 2012

(65) Prior Publication Data

US 2013/0052796 A1 Feb. 28, 2013

Related U.S. Application Data

(63) Continuation of application No. PCT/JP2011/060449, filed on Apr. 28, 2011.

(30) Foreign Application Priority Data

Apr. 28, 2010 (JP) ................................. 2010-104258

(51) Int. Cl.  
  *H01L 21/00* (2006.01)
(52) U.S. Cl.  
  USPC ........................................................ 438/118
(58) Field of Classification Search  
  USPC ................................................. 438/118, 618  
  See application file for complete search history.

(56) References Cited

U.S. PATENT DOCUMENTS

| 2008/0128903 A1* | 6/2008 | Okayama et al. ............ 257/737 |
| 2009/0057903 A1* | 3/2009 | Okayama et al. ............ 257/741 |
| 2009/0196011 A1* | 8/2009 | Kobayashi et al. .......... 361/820 |

FOREIGN PATENT DOCUMENTS

| JP | 09-289264 A | 11/1997 |
| JP | 2008-053693 A | 3/2008 |
| JP | 2008-109109 A | 5/2008 |
| JP | 2008-277742 A | 11/2008 |

OTHER PUBLICATIONS

International Search Report, w/ English translation thereof, issued in International Patent Application No. PCT/JP2011/060449 dated Aug. 2, 2011.

International Preliminary Report on Patentability, w/ English translation thereof, issued in International Application No. PCT/JP2011/060449 mailed Aug. 2, 2011.

* cited by examiner

*Primary Examiner* — Bradley K Smith  
(74) *Attorney, Agent, or Firm* — McDermott Will & Emery LLP

(57) ABSTRACT

A semiconductor substrate and a copper sheet stacked with an insulating resin layer are bonded together at a temperature of 130° C. or below (first temperature) so that an element electrode provided on the semiconductor substrate connects to the copper sheet before a thinning process. Then the semiconductor substrate and the copper sheet, on which the insulating resin layer has been stacked, are press-bonded at a high temperature of 170° C. or above (second temperature) with the copper sheet thinned to thickness of a wiring layer. Then the wiring layer (rewiring) is formed by patterning the thinned copper sheet.

19 Claims, 9 Drawing Sheets

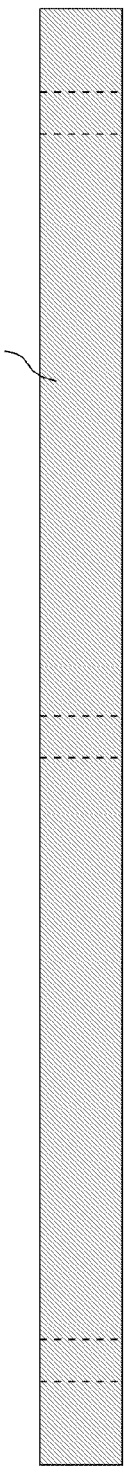
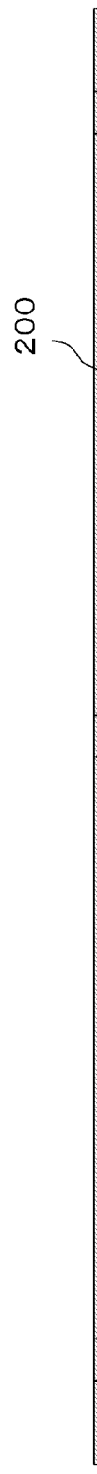
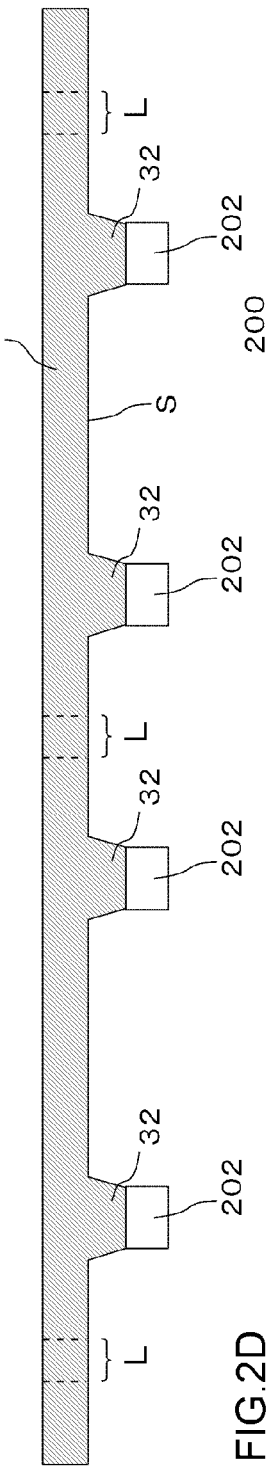
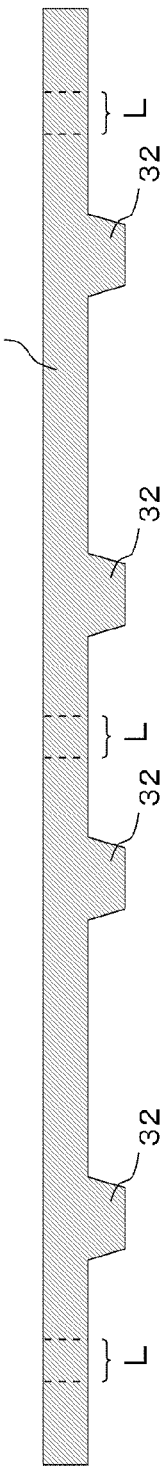

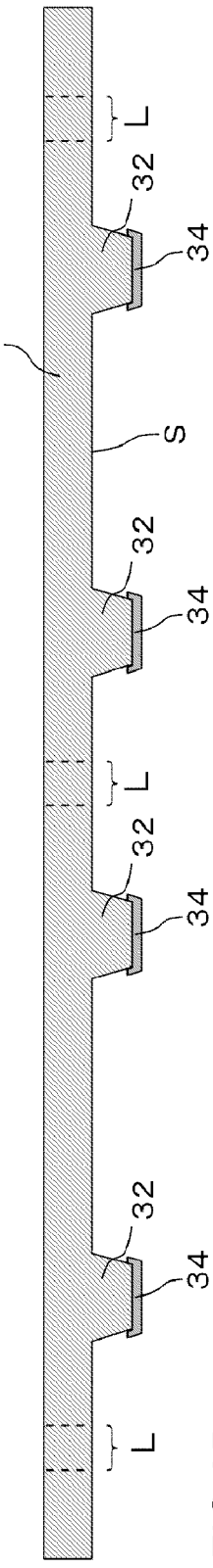
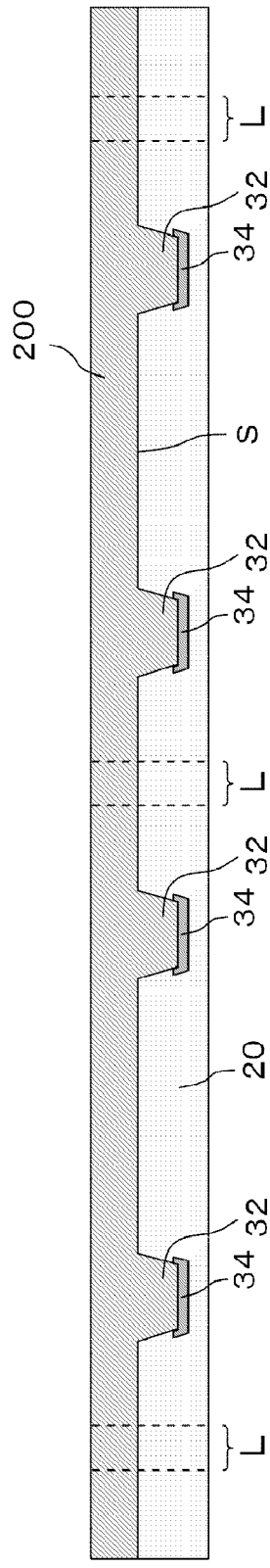
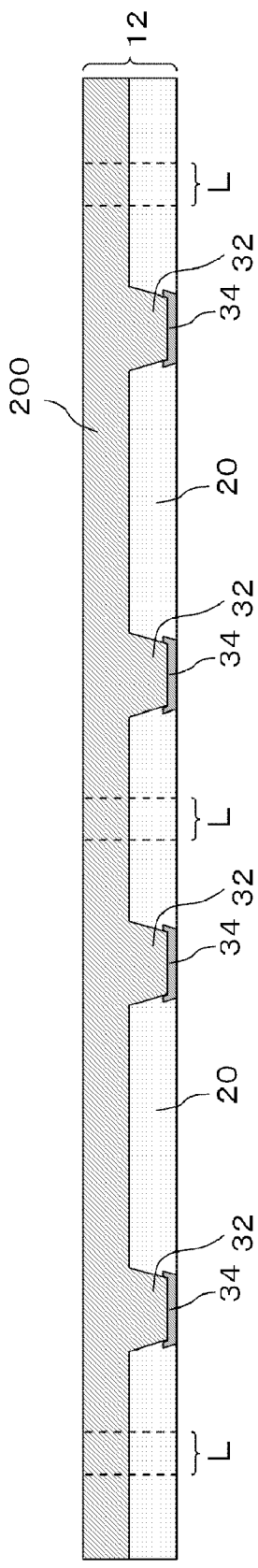

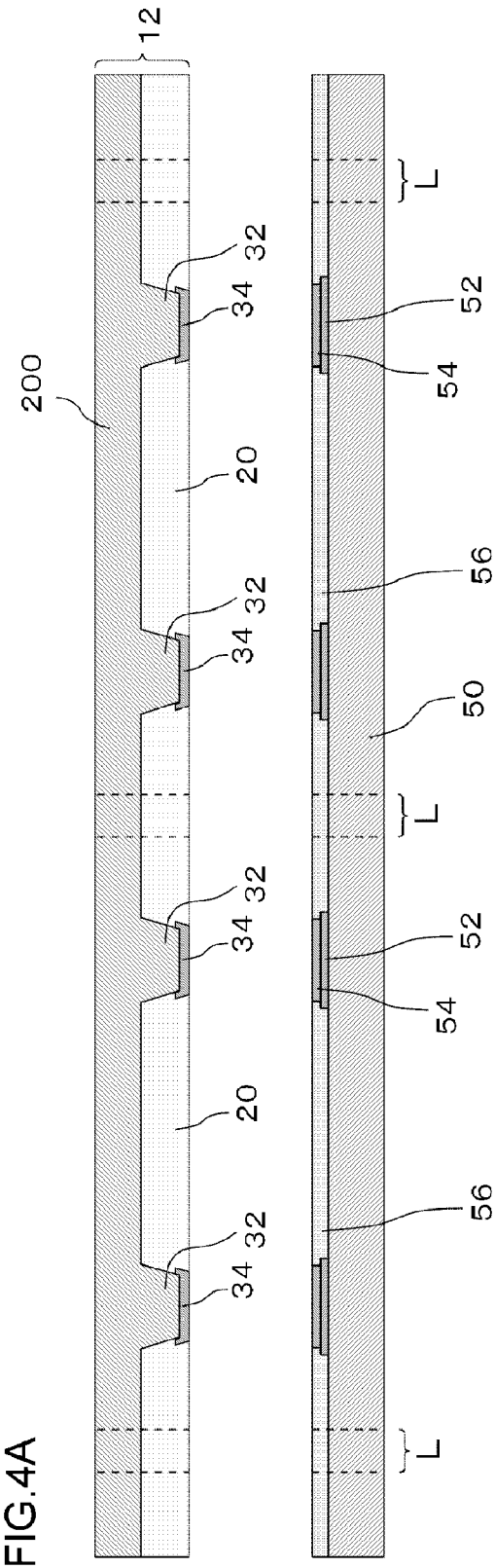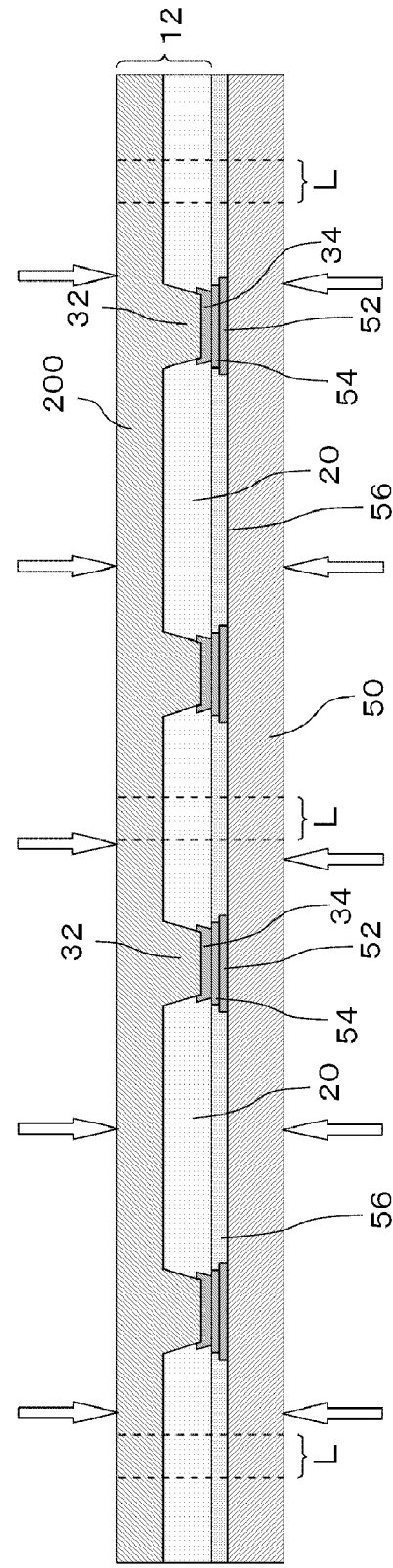

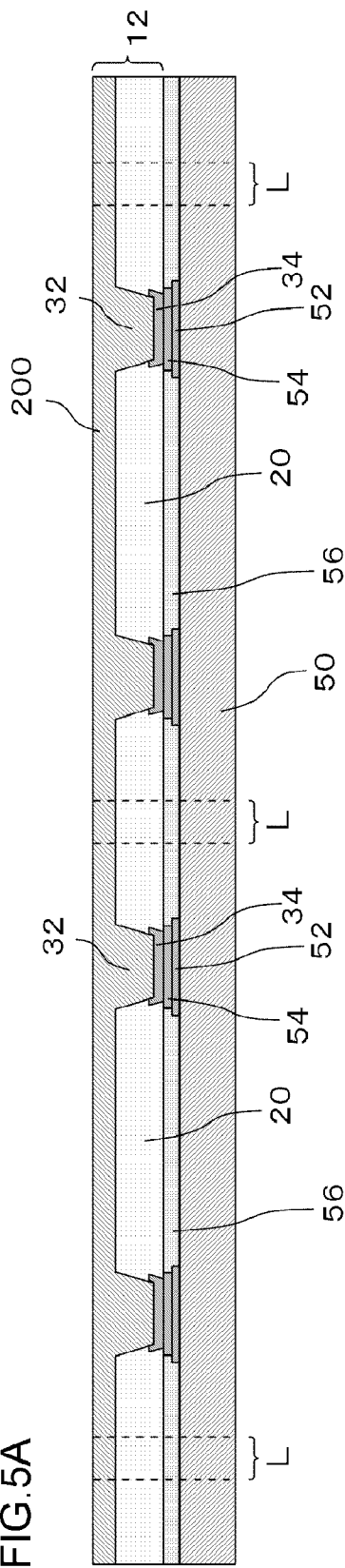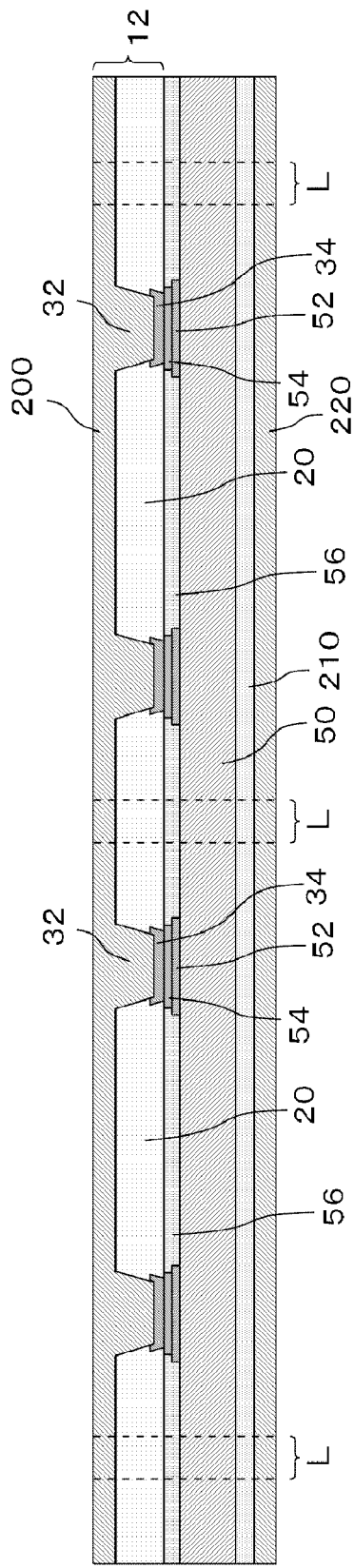

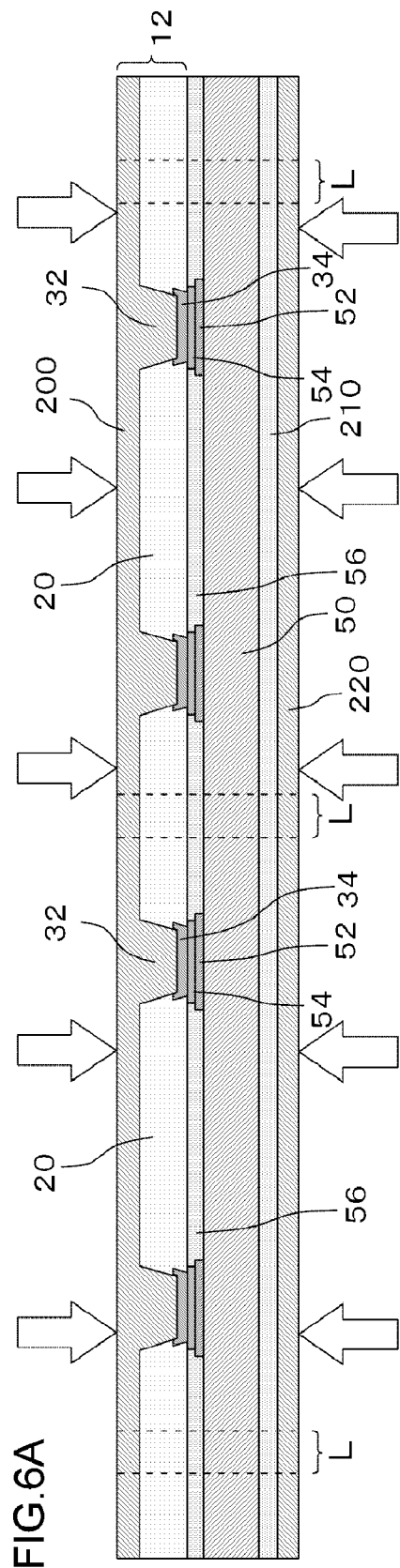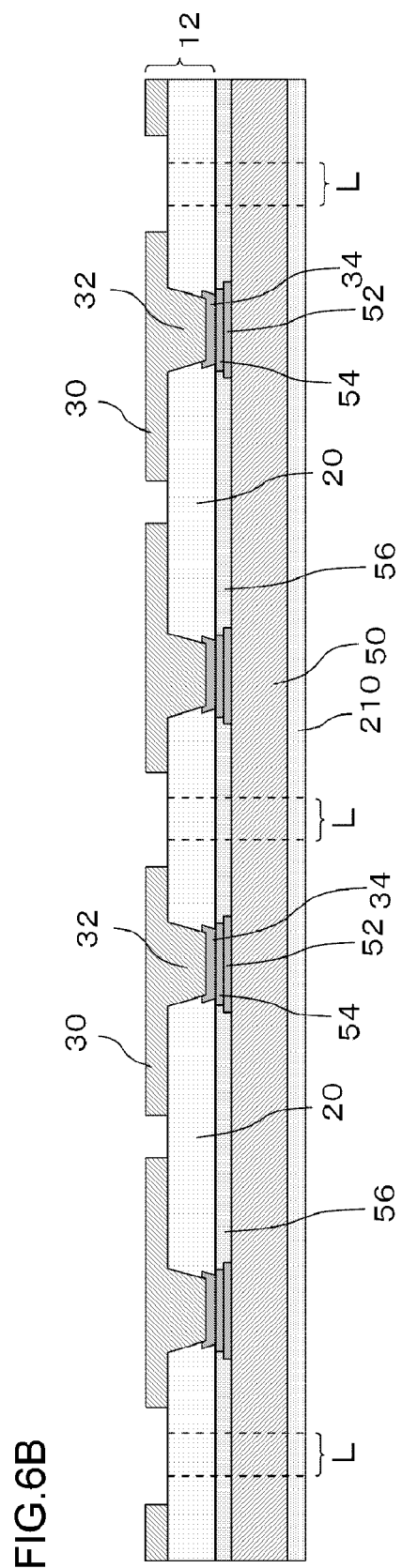

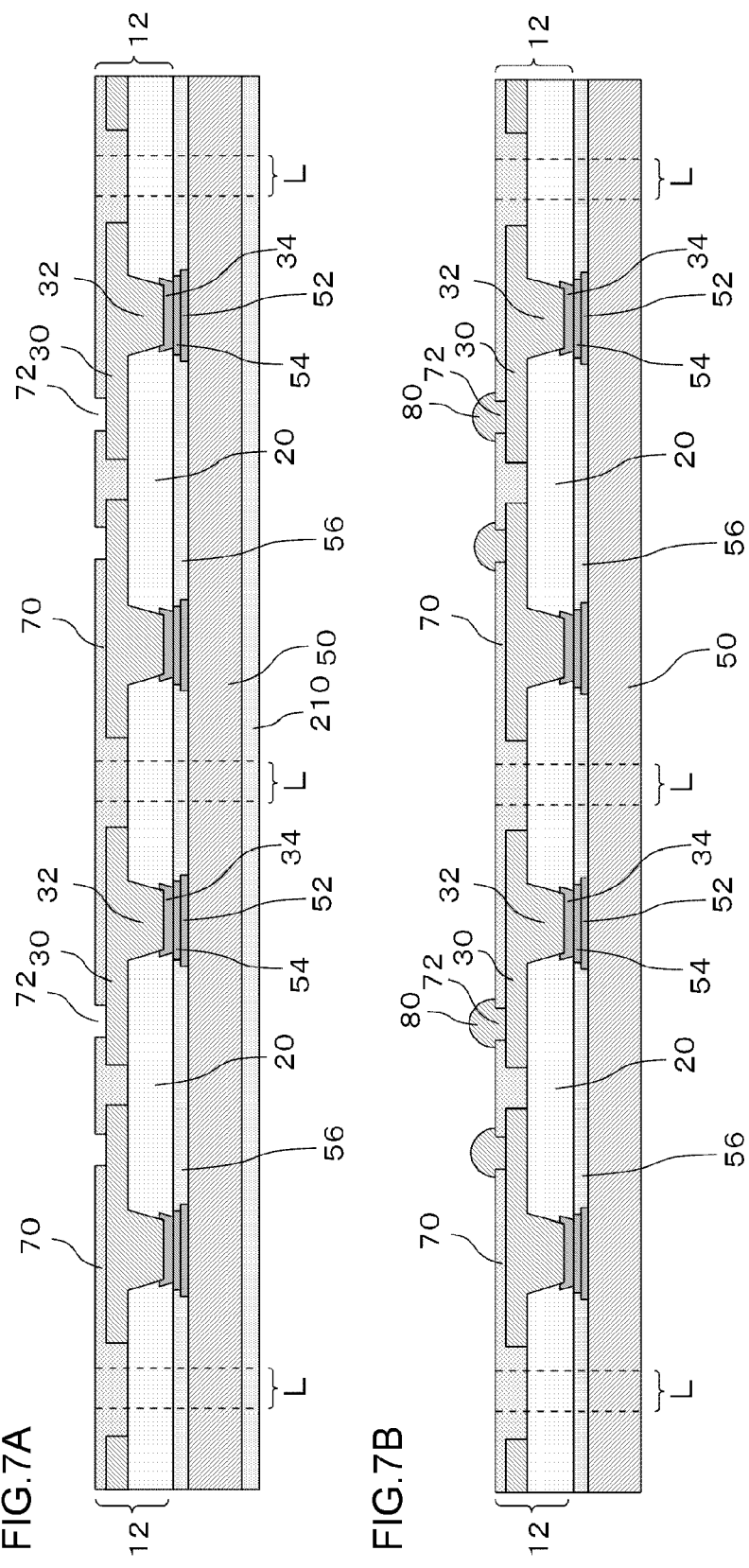

METHOD FOR MANUFACTURING A CIRCUIT DEVICE

RELATED APPLICATIONS

This application is a Continuation of PCT/JP2011/060449, filed on Apr. 28, 2011, which claims priority to application JP 2010-104258 filed Apr. 28, 2010, the disclosures of which are incorporated by reference herein.

BACKGROUND OF THE INVENTION

1. Field of the Invention

The present invention relates to a method for manufacturing a circuit device in a manner such that a semiconductor substrate and a wiring substrate, which have different coefficients of thermal expansions, are bonded together.

2. Description of the Related Art

A packaging technology called CSP (Chip Size Package) is conventionally available for circuit devices or circuit chips. A circuit device according to the CSP is formed such that a semiconductor wafer (semiconductor substrate), where LSIs (circuit elements) and external connection electrodes connected to the circuit elements are formed on one main surface, is diced into individual pieces (semiconductor devices). Thus, the circuit device can be fixed onto a wiring substrate in a size practically the same as an LSI chip. This helps realize the miniaturization of the wiring substrate (motherboard) on which the circuit device is mounted.

In recent years, with miniaturization and higher performance in electronic devices, demand has been ever greater for further miniaturization of circuit devices used in the electronic devices. With such miniaturization and downsizing of circuit devices, it is of absolute necessity that the pitch of electrodes to enable mounting on a motherboard be made narrower. A known method of surface-mounting a circuit device is flip-chip mounting in which solder balls are formed on the external connection electrodes of the circuit device and the solder balls are soldered to an electrode pad of the motherboard. With this flip-chip mounting method, however, there are restrictive factors for the narrowing of the pitch of external connection electrodes, such as the size of the solder ball itself and the bridge formation at soldering. Recently, to overcome these limitations, the external connection electrodes are rearranged by forming the rewiring in the circuit device. As one method used for such rearrangement, known is a method, for example, where a bump structure formed by half-etching a metallic sheet is used as an electrode or a via, and the external connection electrodes of the circuit device are connected to the bump structure by mounting the circuit device on the metallic sheet with an insulating layer, such as epoxy resin, held between the circuit device and the metallic sheet (see Reference (1) in the following Related Art List, for instance).

Related Art List (1) Japanese Unexamined Patent Application Publication (Kokai) No. Hei09-289264.

As the rewiring is formed by the press-forming at a stage where a plurality of circuit devices are arranged on the semiconductor substrate, the wafer may be warped in a cooling process after the press-forming because of a difference in the coefficients of thermal expansion between the semiconductor substrate and a metal (e.g., copper) constituting the rewiring. The warping of the wafer may cause a crack and the like in the wafer, thereby causing a displacement within the plane in the depth of focus in a lithography process. This results in a problem that the exposure cannot be executed or controlled properly.

SUMMARY OF THE INVENTION

The present invention has been made in view of the foregoing problems to be resolved, and a purpose thereof is to provide a technology capable of suppressing the warping of a semiconductor substrate when the circuit devices are manufactured using a wafer-level process technology.

One embodiment of the present invention relates to a method for fabricating a circuit device. The method includes: preparing a semiconductor substrate and a wiring substrate, wherein an element electrode is provided on one main surface of the semiconductor substrate and wherein a metallic sheet is provided on one main surface of the wiring substrate, whereas a substrate electrode corresponding to the element electrode is provided on the other main surface thereof; and thinning the metallic sheet such that the thickness of the metallic sheet is substantially equal to that of a wiring layer, and the method further includes: a first press-bonding process of bonding together the semiconductor substrate and the wiring substrate at a first temperature applied thereto such that the element electrode connects to the substrate electrode, the first press-bonding process being performed after the preparation process and before the thinning process; and a second press-bonding process of press-bonding the semiconductor substrate and the wiring substrate, which have been bonded together at the first temperature, at a second temperature that is higher than the first temperature, the second press-bonding process being performed after the thinning process.

By employing the method of fabricating the circuit device according to this embodiment, the temperature is set to a low value when the wiring substrate and the semiconductor substrate are bonded together. As a result, a stress applied to the semiconductor substrate due to the difference in the coefficients of thermal expansion between the metallic sheet before the thinning process and the semiconductor substrate can be reduced. This can suppress the occurrence of the warping of or a damage to the semiconductor substrate. Also, the wiring substrate and the semiconductor substrate are bonded together at a low temperature and then the metallic sheet provided on the wiring substrate is turned into thin film. Then the wiring substrate and the semiconductor substrate are press-bonded to each other at a high temperature. This can reduce the ratio of metal having a relatively high thermal expansion coefficient in the high-temperature press-bonding. As a result, the adhesion strength of the junction between the wiring substrate and the semiconductor substrate can be enhanced while the stress applied to the semiconductor substrate is reduced and the occurrence of the warping of and a damage to the semiconductor substrate is suppressed.

In the above-described method for fabricating the circuit device, another metallic sheet whose thickness is substantially equal to that of the metallic sheet, which has been turned into thin film, may be bonded to a surface of the element electrode opposite to an electrode forming surface, in the second press-bonding process. The above-described method for fabricating the circuit device may further include forming the wiring layer by patterning the thinned metallic sheet, after the second press-bonding process. Also, in the second press-bonding process, bonding another metallic sheet whose thickness is substantially equal to that of the metallic sheet, which has been turned into thin film, to a surface of the element electrode opposite to an electrode forming surface and forming the wiring layer by patterning the thinned metallic sheet after the second press-bonding process may be performed in parallel with removing the another metallic sheet.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which:

FIGS. 2A to 2D are schematic cross-sectional views showing a process in a method for manufacturing a circuit device according to an embodiment;

FIGS. 3A to 3C are schematic cross-sectional views showing a process in a method for manufacturing a circuit device according to an embodiment;

FIGS. 4A and 4B are schematic cross-sectional views showing a process in a method for manufacturing a circuit device according to an embodiment;

FIGS. 5A and 5B are schematic cross-sectional views showing a process in a method for manufacturing a circuit device according to an embodiment;

FIGS. 6A and 6B are schematic cross-sectional views showing a process in a method for manufacturing a circuit device according to an embodiment;

FIGS. 7A and 7B are schematic cross-sectional views showing a process in a method for manufacturing a circuit device according to an embodiment;

DETAILED DESCRIPTION OF THE INVENTION

Figure 1:
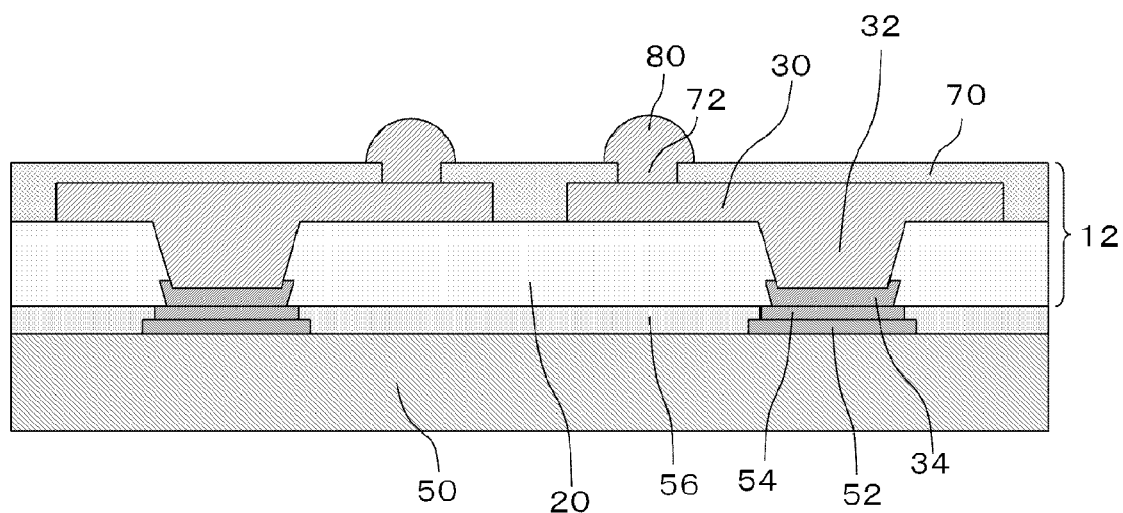
FIG. 1 a schematic cross-sectional view illustrating a structure of a circuit device according to an embodiment of the present invention.

The invention will now be described by reference to the preferred embodiments. This does not intend to limit the scope of the present invention, but to exemplify the invention.

Hereinbelow, the preferred embodiments will be described with reference to the accompanying drawings. Note that in all of the Figures the same reference numerals are given to the same components and the description thereof is omitted as appropriate.

FIG. 1 a schematic cross-sectional view illustrating a structure of a circuit device 10 according to an embodiment of the present invention. The circuit device 10 includes a wiring substrate 12 and a semiconductor substrate 50 bonded to the wiring substrate 12.

The wiring substrate 12 includes an insulating resin layer 20 formed of an insulating resin, a wiring layer 30 provided on one of main surfaces of the insulating resin layer 20, and a plurality of bump electrodes 32, which electrically connect to the wiring layer 30 and protrude from the wiring layer 30 toward the insulating layer 20.

The insulating resin layer 20 may be formed of a thermosetting resin such as a melamine derivative (e.g., BT resin), liquid-crystal polymer, epoxy resin, PPE resin, polyimide resin, fluorine resin, phenol resin or polyamide bismaleimide, or the like. From the viewpoint of improving the heat radiation of the circuit device 10, it is desirable that the insulating resin layer 20 has a high thermal conductivity. In this respect, it is preferable that the insulating resin layer 20 contains, as a high thermal conductive filler, silver, bismuth, copper, aluminum, magnesium, tin, zinc, or an alloy of two or more elements selected from thereamong.

The wiring layer 30, which is provided on one main surface of the insulating resin layer 20, is formed of a conducive material, preferably of a rolled metal or more preferably of a rolled copper. A plurality of bump electrodes 32 are, in a producing manner, on an insulating resin layer 20 side. In the present embodiment, the wiring layer 30 and the bump electrode 32 are formed integrally with each other, but this should not be considered as limiting.

The planar view of each of the bump electrodes 32 is a round shape, and each bump electrode 32 has a side surface which is shaped with a diameter smaller toward a head portion. Note here that the shape of the bump electrode 32 is not limited to any particular shape and may be, for instance, in the shape of a cylinder with a predetermined diameter. Also, the bump electrode 16 may be polygonal, such as quadrangular, when viewed planarly.

An Au/Ni layer 34 is provided on a top face of the bump electrode 32. The Au/Ni layer 34 is composed of an Au layer, which is the exposed surface of the Au/Ni layer 34, and a Ni layer, which is held between the Au layer and the top face of the bump electrode 32.

A protective layer 70 is provided on a main surface of the wiring layer 30 opposite to the second insulating resin layer 20. This protective layer 70 protects the wiring layer 30 against oxidation or the like. The protective layer 70 may be a solder resist layer, for instance. An opening 72 is formed in a predetermined region of the protective layer 70, and the wiring layer 30 is partially exposed by the opening 72. A solder ball 80, which functions as the external connection electrode, is formed within the opening 72. And the solder ball 80 and the wiring layer 30 are electrically connected to each other. The position in which the solder ball 80 is formed, namely, the area in which the opening 72 is formed is, for instance, a targeted position where circuit wiring is extended through a rewiring (the wiring layer 30).

An element electrode 52, an Au/Ni layer 54, and a protective layer 56 are formed on one main surface of the semiconductor substrate 50. More specifically, the semiconductor substrate 50 is a silicon substrate such as a P-type silicon substrate and has a thermal expansion factor different from that of the wiring layer 30. The thermal expansion coefficient of the silicon substrate is smaller by one order of magnitude smaller than that of copper. A predetermined integrated circuit (not shown) and the element electrode 53 positioned in an outer periphery of the predetermined integrated circuit are formed on one main surface of the semiconductor substrate 50. The element electrode 52 is made of a metal such as aluminum or copper. An insulating-type protective layer 56 to protect the semiconductor substrate 50 is formed in a region on the main surface of the semiconductor substrate 50 excepting the element electrodes 52. The protective layer 56 to be used may be a silicon nitride film (SiN) or polyimide (PI), for instance. The Au/Ni layer 54 is formed on top of the element electrode 52 such that the Au layer is an exposed surface. Note here that the semiconductor substrate 50 may be referred to as "semiconductor device" also.

Gold of the Au/Ni layer 34 provided on the top face of the bump electrode 32 and gold of the Au/Ni layer 54 provided on the surface of the element electrode 52 are Au—Au bonded to each other and thereby the bump electrode 32 and the element electrode 52 corresponding to the bump electrode 32 are electrically connected to each other. The Au—Au bonding of the Au/Ni layer 34 and the Au/Ni layer 54 contributes an improved connection reliability between the bump electrode 32 and the element electrode 52 corresponding thereto.

(Method for Fabricating a Circuit Device)

Now, referring to FIGS. 2A to 8, a method for fabricating a circuit device according to an embodiment will be described.

As illustrated in FIG. 2A, a copper sheet 200 is first prepared as a metallic sheet having a thickness greater than at least the sum of the height of the bump electrode 32 and the thickness of the wiring layer 30. The thickness of the copper sheet 200 is about 65 μm, for instance. A rolled metal formed of a rolled copper is used as the copper sheet 200.

Then, as shown in FIG. 2B, resists 202 are formed selectively in alignment with a pattern that corresponds to a predetermined formation region of the bump electrodes 32 as shown in FIG. 1 in each demarcated region surrounded by scribe lines L, using a lithography method. More specifically, a resist film having a predetermined film thickness is affixed to the copper sheet 200 by using a laminating apparatus, and this resist is then subjected to exposure using a photo mask having a pattern of bump electrodes 1032. After this, the resists 202 are selectively formed on top of the copper sheet 200 by a development. To improve the adhesion of the resists 202 to the copper sheet 200, it is desirable that a pretreatment, such as grinding and cleaning, be performed as necessary on the surface of the copper sheet 200 before the lamination of the resist film thereon. Also, the copper sheet 200 is protected by forming a resist protective film (not shown) on the entire surface (top surface side in FIG. 2B) opposite to the surface on which the resists 202 have been provided.

Then, as shown in FIG. 2C, using the resists 202 as a mask, the bump electrodes 32 of a predetermined pattern protruding from a surface S of the copper sheet 200 is formed by performing the wet etching on the copper sheet 200, in which a chemical such as ferric chloride solution or the like is used. In so doing, the bump electrodes 32 are formed such that each bump electrode 32 has a tapered side surface whose diameter (dimension) decreases as the side surface of the bump electrode 32 approaches the tip end thereof. The height of the bump electrode 32 may be 20 μm, for instance.

Then, as shown in FIG. 2D, the resists 202 and the resist protective film are removed using a remover. The bump electrodes 32 are integrally formed on the copper sheet 200 through a process as described above.

Then, as shown in FIG. 3A, the Au/Ni layer 34 is formed on the top face of the bump electrode 32. In the Au/Ni layer 34, an Au layer is the exposed surface of the Au/Ni layer 34, and a Ni layer is held between the Au layer and the top face of the bump electrode 32. A method of forming the Au/Ni layers 34 may be as follows, for instance. A not-shown resist is stacked on a surface S side of the copper sheet 200 and then openings are formed in positions corresponding to the top faces of the bump electrodes 32 using the lithography method. Then the Au/Ni layers 34 are formed on the inside of the openings by electrolytic plating or electroless plating. In the Au/Ni layer 34, the thickness of Au layer may be about 0.25 μm and the thickness of the Ni layer may be about 1 to 3 μm, for instance. Note that, instead of the Au/Ni layer 34, a metallic layer may be formed on the top face of the bump electrode 32 using gold paste.

Then, as shown in FIG. 3B, the insulating resin layer 20 is stacked in the surface S of the copper sheet 200 on a side where the bump electrodes 32 are provided, using a roll laminator or hot press machine. For example, a thermosetting, epoxy-based adhesive resin film may be used as the insulating resin layer 20. The insulating resin layer 20 to be laminated may have a thickness enough to cover the top surface of the bump electrode 32. Since the epoxy-based adhesive resin film is bonded to the semiconductor substrate 50 in a process described later, the temperature of the epoxy-based adhesive resin film at the time it is stacked on the copper sheet 200 is preferably a temperature of 100° C. or below which does not cause the epoxy-based adhesive resin film to become completely hardened.

Then, as shown in FIG. 3C, the insulating resin layer 20 is turned into thin film by the use of $O_2$ plasma etching or polishing so that the top surface of the bump electrode 32 is exposed and the top surface of the bump electrode 32 is coplanar with the lower surface of the insulating resin layer 20. This forms the wiring substrate comprised of the bump electrodes 32 and the insulating resin layer 20.

Then, as shown in FIG. 4A, prepared is a semiconductor substrate 50 where the element electrodes 52, the Au/Ni layers 54 and the protective layer 56 are formed on one main surface. More specifically, a predetermined integrated circuit is formed on one main surface of the semiconductor substrate 50, such as a P-type silicon substrate, and the element electrodes 52 are formed in the outer periphery of the integrated circuit by the use of a semiconductor manufacturing process that combines known techniques including lithography, etching, ion implantation, film formation and thermal processing. The element electrode 52 is made of a metal such as aluminum or copper. The insulating protective layer 56 to protect the semiconductor substrate 50 is formed on the main surface of the semiconductor substrate 50 excluding the electrode electrodes 32. As the protective layer 56, a silicon dioxide film ($SiO_2$), a silicon nitride film (SiN), a polyimide (PI) or the like is preferably used. The Au/Ni layer 54 is formed on top of the element electrode 52 such that the Au layer is an exposed surface. The structure of the Au/Ni layer 54 and the method for forming the Au/Ni layer 54 are similar to those of the Au/Ni layer 34. And the Au/Ni layer 54 may be formed such that a mask having the openings where the surfaces of the element electrodes 52 are exposed is formed and then the electrolytic plating or electroless plating is performed on the inside the openings with the mask formed thereon.

Then, as shown in FIG. 4B, the positioning of the Au/Ni layers 54 and the Au/Ni layers 34 provided on top of the bump electrodes 32 in association with the respective Au/Ni layers 54 is done and then the wiring substrate 12 and the semiconductor substrate 50 are bonded to each other by the use of a press machine. The temperature used when the wiring substrate 12 and the semiconductor substrate 50 are bonded together is a low temperature (first temperature) ranging from 80° C. (inclusive) to 130° C. (inclusive), more preferably ranging from 90° C. (inclusive) to 130° C. (inclusive). If the bonding temperature is lower than 80° C., the bonding strength will not be enough for the bonding. If the bonding temperature is higher than 130° C., the warping of the semiconductor substrate 50 will be large. The time duration and the pressure used in this process where the wiring substrate 12 and the semiconductor substrate 50 are bonded to each other are three minutes and 1 MPa, respectively, for instance.

Then, as shown in FIG. 5A, the surface of the copper sheet 200 on a side opposite to the side where the bump electrodes 32 are provided is etched back using a chemical such as ferric chloride solution, and the copper sheet 200 is turned into thin film thereby. As a result, the copper sheet 200 is so processed as to have a predetermined thickness (the thickness of the wiring layer 30). And the copper sheet 200 with which predetermined bump electrodes 32 are integrally formed is formed. The thickness of the copper sheet 200 that has been thinned is about 15 μm, for instance.

Then, as shown in FIG. 5B, a copper foil 220 used to prevent the warping is placed on a surface opposite to an electrode forming surface of the semiconductor substrate 50, via an adhesive resin layer 210. The thickness of the copper foil 220 is equal to the thickness of the copper sheet 200.

Then, as shown in FIG. 6A, the wiring substrate 12 and the semiconductor substrate 50 are press-bonded to each other by using the press machine. In so doing, the anti-warping copper foil 220 is bonded, by a press-bonding technique, to a surface of the semiconductor substrate 50 opposite to the electrode forming surface thereof, via the adhesive resin layer 210. The temperature used when the wiring substrate 12 and the semiconductor substrate 50 are bonded together is a temperature (second temperature) higher than that shown in FIG. 4B. This second temperature is a temperature at which the insulating resin layer 20 becomes completely hardened, namely a temperature at which the reaction rate of resin in the insulating resin layer 20 is 95% or above. Although depending on a material used for the insulating resin layer 20, the temperature used when the wiring substrate 12 and the semiconductor substrate 50 are press-bonded to each other may be 170° C. or above. If, for example, the temperature when the wiring substrate 12 and the semiconductor substrate 50 are press-bonded to each other is 170° C., the press-bonding time will be 45 minutes. If, for example, the temperature when the wiring substrate 12 and the semiconductor substrate 50 are press-bonded to each other is 200° C., the press-bonding time will be 10 minutes. The pressure applied in this process where the wiring substrate 12 and the semiconductor substrate 50 are press-bonded to each other is 1 MPa, for instance. The upper limit of a high-temperature range is a temperature at which the insulating resin layer 20 is chemically decomposed, and specifically 300° C.

The bonding process shown in FIG. 4B is a first press-boding process where the wiring substrate 12 and the semiconductor substrate 50 are temporarily bonded to each other. The press-bonding process shown in FIG. 6A is a process where the wiring substrate 12 and the semiconductor substrate 50 are bonded to each other as the final stage or a second press-bonding process described as above with reference to FIG. 6A. As described above, the method for manufacturing a circuit device according to the present embodiment is characterized by the feature that the wiring substrate 12 and the semiconductor substrate 50 are press-bonded to each other through a two-stage press-boding process including the first press-bonding process performed under a relatively low temperature and the second press-bonding process performed under a relatively high temperature.

Then, as shown in FIG. 6B, the wiring layer (rewiring) 30 is formed by processing the thinned copper sheet 200 into a predetermined pattern using the lithography and etching techniques. As a result, formed is the wiring layer 30 which is so processed as to have a predetermined thickness and with which predetermined bump electrodes 32 are provided integrally. In other words, the bump electrodes 32 and the wiring layer 30, which are made of the same material, are formed continuously as a single body. Also, the copper foil 220 is removed by etching in parallel with the patterning of the copper sheet 200. Both the pattern of copper sheet 200 and the copper foil 220 are removed using the same etchant, so that the manufacturing time and the production cost can both be reduced.

Then, as shown in FIG. 7A, a protective layer (photo solder resist layer) 70 is stacked on the wiring layer 30 and the insulating resin layer 20. Then, the openings 72 are provided in predetermined regions (mounting regions of solder balls) of the protective layer 70 by using the photolithography method. The protective layer 70 functions as a protective film for the wiring layer 30. Epoxy resin or the like is used for the protective layer 70, and the film thickness of the protective layer 70 is about 30 µm, for instance.

Then, as shown in FIG. 7B, the adhesive resin layer 210 is removed by a back-grinding process. Then the solder balls 80 are mounted in the openings 72 of the protective layer 70, by using a screen printing method. More specifically, the solder balls 80 are formed by printing a soldering paste, which is a pasty mixture of resin and solder material, in desired positions through a screen mask and then heating the printed paste to a solder melting point.

Figure 8:
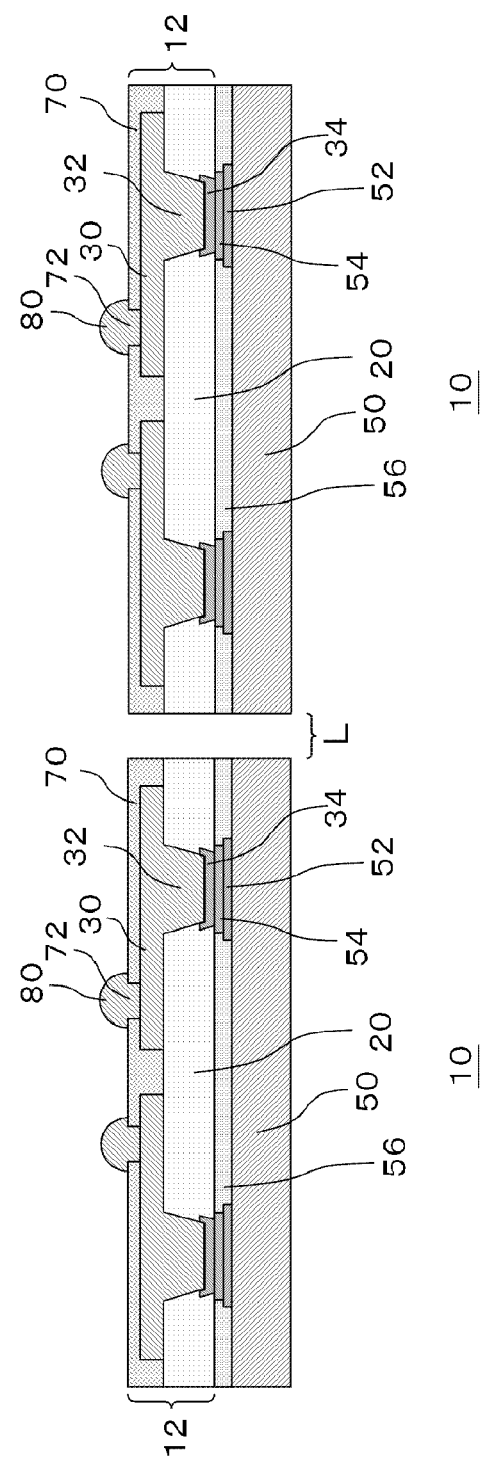
FIG. 8 is a schematic cross-sectional view showing a process in a method for manufacturing a circuit device according to an embodiment.

Then, as illustrated in FIG. 8, a circuit device assembly is divided into individual pieces by dicing the wafer along scribe lines L.

Through the processes as described above, the circuit devices according to the first embodiment are manufactured. In the above-described method for manufacturing the circuit device, the copper sheet 200 that constitutes the wiring substrate 12 is not thinned at a stage prior to the stage where the wiring substrate 12 and the semiconductor device 50 are bonded together, and the then copper sheet 200 has a thickness of about 45 µm. Thus, the occurrence of creases in the copper sheet 200 can be suppressed and, at the same time, the handling of the copper sheet 200 itself and the wiring substrate 12 where the copper sheet 200 is provided can be made easy.

The temperature is set to a low value when the wiring substrate 12 and the semiconductor substrate 50 are bonded together. As a result, the stress applied to the semiconductor substrate 50 due to the difference in the coefficients of thermal expansion between the copper sheet 200 before the thinning process and the semiconductor substrate 50 can be reduced. This can suppress the occurrence of the warping of or a damage to the semiconductor substrate 50.

Also, the wiring substrate 12 and the semiconductor substrate 50 are bonded together at a low temperature and then the copper sheet 200 provided on the wiring substrate 12 is turned into thin film. Then the wiring substrate 12 and the semiconductor substrate 50 are press-bonded to each other at a high temperature. This can reduce the ratio of the copper sheet 200 having a relatively high thermal expansion coefficient at the processing of the high-temperature press-bonding. As a result, the adhesion strength of the junction between the wiring substrate 12 and the semiconductor substrate 50 can be enhanced while the stress applied to the semiconductor substrate 50 is reduced and the occurrence of the warping of and a damage to the semiconductor substrate 50 is suppressed.

When the wiring substrate 12 and the semiconductor substrate 50 are press-bonded to each other at a high temperature, the copper foil 220 whose thickness is substantially equal to that of the copper sheet 200, which has been turned into thin film, is bonded to the semiconductor substrate 50. As a result, the stress applied to the semiconductor substrate 50 by the copper sheet 200 is canceled out by the stress applied thereto by the copper foil 220. Hence, the occurrence of the warping of and a damage to the semiconductor substrate 50 can be further suppressed.

As result of the reduced warping in the semiconductor substrate 50, the processing accuracy of the wiring layer 30 can be improved. Hence, the accuracy with which the width of line in the wiring layer 30 is processed can be improved and, moreover, the variation in resistivity can be suppressed.

(Relation Between a Temperature at the Time of the Low-Temperature Bonding and the Warping)

Here, the temperature when the first press-bonding process is performed at a relatively low temperature is expressed as a "low-temperature bonding temperature". A copper sheet whose thickness is 45 μm is bonded to a 6-ich Si wafer with an insulating resin layer of 20 μm in thickness held between the copper sheet and the wafer at varying temperatures, and then the amount of Si wafer warping is measured at the position 75 mm away from the center of the Si wafer. The amount of the Si wafer warping at each bonding temperature is shown in Table 1. Note the Si wafer, the insulating resin layer, and the copper sheet correspond to the semiconductor substrate 50, the insulating resin layer 20, and the copper sheet 200, respectively, in the above-described embodiments.

Further, the copper sheet bonded to the Si wafer is etched down so as to be turned into thin film of 15 μm in thickness. The film thickness of the copper sheet is measured at each of ten locations of the copper sheet that has been turned into thin film, and then the variation in the film thickness of copper sheet within the plane is calculated. The variation in the film thickness thereof in the plane is the difference between the maximum value and the minimum value. The film thickness of the copper sheet after etch-down at each bonding temperature is shown in Table 1. Also, a graph indicating the relation between the low-temperature bonding temperature (first temperature) and the variation in the film thickness of copper sheet within the plane is shown in FIG. 9.

TABLE 1

| | Temperature used when the bonding is done at a low temperature (° C.) | | | | | | | | |
|---|---|---|---|---|---|---|---|---|---|
| | 90 | 100 | 130 | 135 | 145 | 150 | 155 | 170 | 200 |
| Amount of substrate warping after 1st step | 0.5 | 1.1 | 2.6 | 3.3 | 4.9 | 5.1 | 5.7 | 7.9 | 10.3 |
| Variation in film thickness of Cu after etch-down (μm) | 0.88 | 0.91 | 0.84 | 1.13 | 2.14 | 2.11 | 2.41 | 3.27 | 4.13 |

Figure 9:
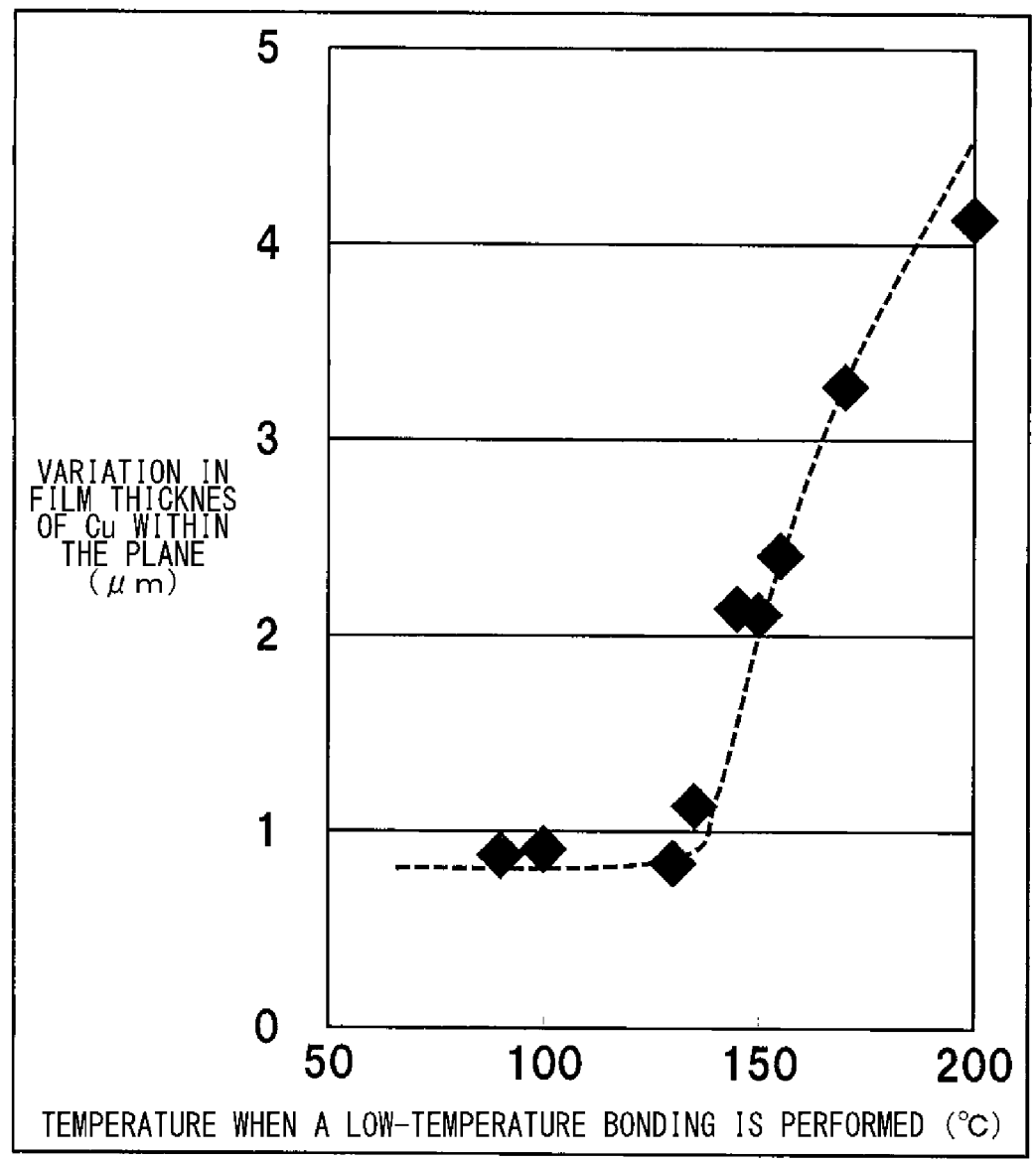
FIG. 9 shows a relationship between the temperature at the time of a low-temperature bonding and the variation in the film thickness of copper sheet within the plane.

As Table 1 and FIG. 9 show, it is evident that the lower the low-temperature bonding temperature is, the in-plane variation in the film thickness of copper sheet after the thinning process tends to be reduced more and smaller. As the low-temperature bonding temperature becomes 130° C. or below, it is found that the in-plane variation in the film thickness of copper sheet after the thinning process is drastically reduced. This is speculated because the lower the bonding temperature is, the less the amount of the warping of Si wafer, to which the copper sheet has been bonded, will be. If the amount of warping is 2.6 mm or below, the stress inherent in the press-bonding can suppress a damage to the Si wafer after the press-bonding.

Based on the above results, a suitable range of the low-temperature bonding temperatures is preferably 130° C. or below where the amount of Si wafer warping is suppressed to 2.6 mm or below and the in-plane variation of the thinned copper sheet is suppressed to 1.0 μm. Note that the lower limit of the low-temperature bonding temperature is about 80° C. where the insulating resin layer 20 exhibits adhesion function. Here, the temperature when the second press-bonding process is performed at a relatively high temperature is expressed as a "high-temperature bonding temperature (second temperature)". The second temperature is higher than the temperature used when the first press-boding process is performed. And the second temperature is such that when the semiconductor substrate and the wiring substrate are bonded together at the first temperature, the insulating resin layer interposed between the semiconductor substrate and the wiring substrate becomes completely hardened. More specifically, if the insulating resin layer is formed of epoxy resin, the second temperature will be 170° C. or above.

The present invention has been described by referring to each of the above-described embodiments. However, the present invention is not limited to the above-described embodiments only. It is understood that various modifications such as changes in design may be made based on the knowledge of those skilled in the art, and the embodiments added with such modifications are also within the scope of the present invention.

Although, for example, in the above-described embodiments, the copper foil 220 is removed in parallel with the patterning of the copper sheet 200, the copper foil 220 may be kept instead of being removed. In such a case, the copper foil 220 can be made use as a radiation plate. Also, in the above-described embodiments, the adhesive resin layer 210 is removed by the back-grinding process but the adhesive resin layer 210 may be kept on the reverse side of the semiconductor substrate 50. In this case, the reverse side of the semiconductor substrate 50 can be protected.

The features and characteristics of the present invention described based on the embodiments may be defined by the following Item 1 to Item 4:

[Item 1]

A method for fabricating a circuit device, the method including:

a preparation process of preparing a semiconductor substrate and a wiring substrate, wherein an element electrode is provided on one main surface of the semiconductor substrate and wherein a metallic sheet is provided on one main surface of the wiring substrate, whereas a substrate electrode corresponding to the element electrode is provided on the other main surface thereof; and a thinning process of turning the metallic sheet into thin film such that the thickness of the metallic sheet is substantially equal to that of a wiring layer, the method further including:

a first press-bonding process of bonding together the semiconductor substrate and the wiring substrate at a first temperature applied thereto such that the element electrode connects to the substrate electrode, the first press-bonding process being performed after the preparation process and before the thinning process; and a second press-bonding process of press-bonding the semiconductor substrate and the wiring substrate, which have been bonded together at the first temperature, at a second temperature that is higher than the first temperature, the second press-bonding process being performed after the thinning process.

By employing the method of fabricating a circuit device according to Item 1, the temperature is set to a low value when the wiring substrate and the semiconductor substrate are bonded together. As a result, a stress applied to the semiconductor substrate due to the difference in the coefficients of thermal expansion between the metallic sheet before the thinning process and the semiconductor substrate can be reduced. This can suppress the occurrence of the warping of or a damage to the semiconductor substrate. Also, the wiring substrate and the semiconductor substrate are bonded together at a low temperature and then the metallic sheet provided on the wiring substrate is turned into thin film. Then the wiring substrate and the semiconductor substrate are press-bonded to each other at a high temperature. This can reduce the ratio of metal having a comparatively high thermal expansion coefficient at the processing of the high-temperature press-bonding. As a result, the adhesion strength of the junction between the wiring substrate and the semiconductor substrate can be enhanced while the stress applied to the semiconductor substrate is reduced and the occurrence of the warping of and a damage to the semiconductor substrate is suppressed.

[Item 2]
A method, for fabricating a circuit device, according to Item 1, wherein the first temperature is 130° C. or below.

[Item 3]
A method, for fabricating a circuit device, according to Item 1 or Item 2, wherein an insulating resin layer is held between the semiconductor substrate and the metallic substrate, and
wherein the second temperature is such that the reaction rate of resin in the insulating resin layer is 95% or above.

[Item 4]
A method, for fabricating a circuit device, according to any one of Item 1 to Item 3, wherein the second temperature is 170° C. or above.

What is claimed is:

1. A method for fabricating a circuit device, the method comprising:
    preparing a semiconductor substrate and a wiring substrate, wherein an element electrode is provided on one main surface of the semiconductor substrate and wherein a metallic sheet is provided on one main surface of the wiring substrate, whereas a substrate electrode corresponding to the element electrode is provided on the other main surface thereof; and
    turning the metallic sheet into thin film such that the thickness of the metallic sheet is substantially equal to that of the wiring layer,
    the method further comprising:
    a first press-bonding process of bonding together the semiconductor substrate and the wiring substrate at a first temperature applied thereto such that the element electrode connects to the substrate electrode, the first press-bonding process being performed after the preparation process and before the thinning process; and
    a second press-bonding process of press-bonding the semiconductor substrate and the wiring substrate, which have been bonded together at the first temperature, at a second temperature that is higher than the first temperature, the second press-bonding process being performed after the thinning process.

2. A method, for fabricating a circuit device, according to claim 1, wherein the first temperature is 130° C. or below.

3. A method, for fabricating a circuit device, according to claim 1, wherein an insulating resin layer is held between the semiconductor substrate and the metallic substrate, and
wherein the second temperature is such that the reaction rate of resin in the insulating resin layer is 95% or above.

4. A method, for fabricating a circuit device, according to claim 2, wherein an insulating resin layer is held between the semiconductor substrate and the metallic substrate, and
wherein the second temperature is such that the reaction rate of resin in the insulating resin layer is 95% or above.

5. A method, for fabricating a circuit device, according to claim 1, wherein the second temperature is 170° C. or above.

6. A method, for fabricating a circuit device, according to claim 2, wherein the second temperature is 170° C. or above.

7. A method, for fabricating a circuit device, according to claim 3, wherein the second temperature is 170° C. or above.

8. A method, for fabricating a circuit device, according to claim 4, wherein the second temperature is 170° C. or above.

9. A method, for fabricating a circuit device, according to claim 1, wherein, in the second press-bonding process, another metallic sheet whose thickness is substantially equal to that of the metallic sheet, which has been turned into thin film, is bonded to a surface of the element electrode opposite to an electrode forming surface.

10. A method, for fabricating a circuit device, according to claim 2, wherein, in the second press-bonding process, another metallic sheet whose thickness is substantially equal to that of the metallic sheet, which has been turned into thin film, is bonded to a surface of the element electrode opposite to an electrode forming surface.

11. A method, for fabricating a circuit device, according to claim 3, wherein, in the second press-bonding process, another metallic sheet whose thickness is substantially equal to that of the metallic sheet, which has been turned into thin film, is bonded to a surface of the element electrode opposite to an electrode forming surface.

12. A method, for fabricating a circuit device, according to claim 4, wherein, in the second press-bonding process, another metallic sheet whose thickness is substantially equal to that of the metallic sheet, which has been turned into thin film, is bonded to a surface of the element electrode opposite to an electrode forming surface.

13. A method, for fabricating a circuit device, according to claim 5, wherein, in the second press-bonding process, another metallic sheet whose thickness is substantially equal to that of the metallic sheet, which has been turned into thin film, is bonded to a surface of the element electrode opposite to an electrode forming surface.

14. A method, for fabricating a circuit device, according to claim 6, wherein, in the second press-bonding process, another metallic sheet whose thickness is substantially equal to that of the metallic sheet, which has been turned into thin film, is bonded to a surface of the element electrode opposite to an electrode forming surface.

15. A method, for fabricating a circuit device, according to claim 7, wherein, in the second press-bonding process, another metallic sheet whose thickness is substantially equal to that of the metallic sheet, which has been turned into thin film, is bonded to a surface of the element electrode opposite to an electrode forming surface.

16. A method, for fabricating a circuit device, according to claim 8, wherein, in the second press-bonding process, another metallic sheet whose thickness is substantially equal to that of the metallic sheet, which has been turned into thin film, is bonded to a surface of the element electrode opposite to an electrode forming surface.

17. A method, for fabricating a circuit device, according to claim 1, further comprising forming the wiring layer by patterning the thinned metallic sheet, after the second press-bonding process.

18. A method, for fabricating a circuit device, according to claim 2, further comprising forming the wiring layer by patterning the thinned metallic sheet, after the second press-bonding process.

19. A method, for fabricating a circuit device, according to claim 1, wherein, in the second press-bonding process, bonding another metallic sheet whose thickness is substantially equal to that of the metallic sheet, which has been turned into thin film, to a surface of the element electrode opposite to an electrode forming surface and forming the wiring layer by patterning the thinned metallic sheet are performed in parallel with removing the another metallic sheet.

* * * * *